United States Patent [19]
Bailey et al.

[11] Patent Number: 6,160,696
[45] Date of Patent: Dec. 12, 2000

[54] MODULAR BUS BAR AND SWITCH ASSEMBLY FOR TRACTION INVERTER

[75] Inventors: Ronald Barry Bailey; Dimitrios Ioannidis, both of Erie, Pa.

[73] Assignee: General Electric Company, Erie, Pa.

[21] Appl. No.: 09/072,102

[22] Filed: May 4, 1998

[51] Int. Cl.[7] .............................. H02H 3/00; H02H 73/00
[52] U.S. Cl. ........................... 361/115; 361/62; 361/100; 361/103
[58] Field of Search ................................ 361/23, 18, 30, 361/52, 62, 100, 103, 115, 638

[56] References Cited

U.S. PATENT DOCUMENTS

| | | | |
|---|---|---|---|
| 3,646,400 | 2/1972 | Demarest et al. | 317/100 |
| 3,842,336 | 10/1974 | Galloway | 321/27 R |
| 4,015,184 | 3/1977 | Cooperman | 321/8 C |
| 4,039,921 | 8/1977 | Yoshida et al. | 363/22 |
| 4,458,305 | 7/1984 | Buckle et al. | 363/141 |
| 4,460,956 | 7/1984 | Hamaski | 363/141 |
| 4,691,274 | 9/1987 | Matouk et al. | 363/141 |
| 4,772,999 | 9/1988 | Fiorina et al. | 363/141 |
| 4,872,102 | 10/1989 | Getter | 363/141 |
| 4,884,631 | 12/1989 | Rippel | 165/185 |
| 4,992,925 | 2/1991 | Meyer | 363/141 |
| 5,132,896 | 7/1992 | Nishizawa et al. | 363/144 |
| 5,170,336 | 12/1992 | Getter et al. | 363/141 |
| 5,172,310 | 12/1992 | Deam et al. | 363/144 |
| 5,202,578 | 4/1993 | Hideshima | 275/685 |
| 5,245,527 | 9/1993 | Duff et al. | 363/131 |
| 5,253,613 | 10/1993 | Bailey et al. | 123/41.31 |
| 5,434,770 | 7/1995 | Dreifuerst et al. | 363/65 |
| 5,444,295 | 8/1995 | Lake et al. | 527/678 |
| 5,491,370 | 2/1996 | Schneider et al. | 310/54 |
| 5,492,842 | 2/1996 | Eytcheson et al. | 437/7 |
| 5,493,472 | 2/1996 | Lavene | 361/329 |
| 5,504,378 | 4/1996 | Lindberg et al. | 307/10.1 |
| 5,517,063 | 5/1996 | Schantz, Jr. et al. | 307/9.1 |
| 5,539,254 | 7/1996 | Eytcheson et al. | 257/691 |
| 5,563,447 | 10/1996 | Lake et al. | 257/724 |
| 5,565,705 | 10/1996 | Romero et al. | 257/718 |
| 5,623,399 | 4/1997 | Ishii et al. | 363/132 |
| 5,631,821 | 5/1997 | Muso | 363/141 |
| 5,694,312 | 12/1997 | Brand et al. | 363/144 |
| 5,712,802 | 1/1998 | Kumar et al. | 364/557 |
| 5,936,833 | 8/1999 | Grossman et al. | 361/638 |

*Primary Examiner*—Stephen W. Jackson
*Attorney, Agent, or Firm*—Ann M. Agosti; Jill M. Breedlove

[57] ABSTRACT

An electrical power system includes an inverter having a plurality of insulated gate bipolar transistors (IGBTs) and capacitors for converting DC power to AC power and at least one power bus bar including an interconnecting bus bar and a plurality of extension bus bars. The area between the conductors of the interconnecting bus bar and the extension bus bars is minimized to reduce the inductance between the IGBTs and the capacitors. The extension bus bars are each coupled to the interconnecting bus bar and a respective one of the IGBTs and capacitors. An IGBT can be removed from the inverter without removing the interconnecting bus bar or any other IGBT. The capacitors can be positioned at ninety degree angles with respect to the interconnecting bus bar. In one embodiment, the IGBTs are additionally positioned at ninety degree angles with respect to the interconnecting bus bar. In an alternate embodiment, the IGBTs are positioned parallel with respect to the interconnecting bus bar.

21 Claims, 7 Drawing Sheets

MODULAR BUS BAR AND SWITCH ASSEMBLY FOR TRACTION INVERTER

BACKGROUND OF THE INVENTION

This invention relates to high-power semiconductor switching power regulators such as are used in propulsion systems of diesel-electric locomotives and, more particularly, to a method and apparatus which provide low inductance, sufficient cooling capacity and easy installation and maintenance of insulated gate bipolar transistors (IGBTs) in such power regulators.

Traction vehicles such as, for example, locomotives, employ electric traction motors for driving wheels of the vehicles. In some of these vehicles, the motors are alternating current (AC) motors whose speed and power are controlled by varying the frequency and current of AC electric power supplied to the motors. Commonly, the electric power is supplied at some point in the vehicle system as direct current power and is thereafter inverted to AC power of controlled frequency and amplitude. The electric power may be derived from an on-board alternator driven by an internal combustion engine or may be obtained from a wayside power source such as a third rail or overhead catenary.

In conventional systems the power is inverted in a solid-state inverter incorporating a plurality of diodes and electronic switching devices. In a locomotive, large off-highway vehicle, or transit application, the traction motors may develop more than 1000 horsepower per motor thus requiring very high power handling capability by the associated inverter. This, in turn, requires semiconductor switching devices such as GTOs (gate turn-off thyristors) or IGBTs which are capable of controlling such high power and of dissipating significant heat developed in the semiconductor devices due to internal loss generating characteristics.

The semiconductor devices are mounted on heat transfer devices such as heat sinks which aid in transferring heat away from the semiconductor devices and thus preventing thermal failure of the devices. For these very high power semiconductors it is desirable to use heat sinks having generally hollow interiors through which cooling air can be forced to remove heat. An electrical circuit area in which the semiconductors are located may include the various control and timing circuits, including low power semiconductors, used in controlling switching of the power semiconductors.

In locomotive applications, an inverter for large AC motor applications typically includes six high power GTO or IGBT devices requiring heat sinks and forced air cooling. If IGBTs are used, each of these devices are generally power modules which require one sided cooling. A common arrangement thus requires six heat sinks per inverter. On a six axle locomotive, the inverters will include 36 heat sinks requiring cooling air.

Commonly assigned R. B. Bailey et al., "High Power Inverter Air Cooling", U.S. application Ser. No. 08/839,113, filed Apr. 23, 1997, describes a power converter system for an electric traction motor vehicle in which a plurality of high power IGBT devices are connected in circuit with at least one electric traction motor for controlling electric power to the motor. The IGBT devices are each thermally mounted on generally flat plate heat sinks having a plurality of fins extending therefrom and adapted for passing cooling air therethrough for extracting heat from the devices. The fins may be attached directly to the module heat sink or attached to a separate thermally conductive plate which is thermally bonded to the heat sink. Each of the heat sinks are mounted to a common air plenum forming one wall of an electrical circuit area of the vehicle. Cooling air is directed through the fins and out through an exhaust conduit. The system operates most efficiently if the inductance between the IGBTs and the DC link capacitor is minimized.

A conventional design for low to medium power inverters may include a single five layer bus structure for all three phases which interconnects six IGBT modules and several DC link capacitors. In the event of a failure in an IGBT module, the entire inverter must be removed. For repair, the bus bar must be disconnected from all six IGBT modules and the DC link capacitors before a failed IGBT module can be replaced.

For higher power applications, a single phase assembly generally includes two IGBT and heat sink modules and a DC link capacitor. The IGBT collector of one module is connected to the positive DC bus, the emitter of the IGBT module is connected to the collector of the other IGBT module to form the AC connection point, and the emitter of the other IGBT module is connected to the negative DC bus. An additional bus bar is used to connect bus bars of three of the single phase assemblies to provide three phase power. In the event of an IGBT failure, the pair of IGBT and heat sink modules and typically the local DC link capacitor need to be removed. Although a single phase assembly is removable without removing the other the phases, the removable section remains larger and heavier than desired.

Commonly assigned R. B. Bailey, U.S. Pat. No. 5,253,613 describes a GTO based inverter in which failed GTOs can be removed and replaced without having to remove any other hardware. In conventional IGBT systems, single IGBT/heat sink combinations are not easily replaced.

SUMMARY OF THE INVENTION

It is therefore seen to be desirable to provide a low inductance electrical interconnect system which does not inhibit easy replacement of a single IGBT/heat sink assembly. It is necessary to remove the IGBT and heat sink at the same time in field applications since the critical interface between them is not field controllable.

Briefly, in one embodiment of the present invention, an inverter for converting DC power to AC power in an electrical power system includes: a plurality of IGBTs; a plurality of heat sinks, each heat sink adapted to remove heat from a respective one of the IGBTs; at least one DC link capacitor; and an interconnecting bus bar connecting the DC link capacitor through a plurality of extension bus bars to at least one of the IGBTs, wherein one of the IGBTs, its respective extension bus bar, and its respective heat sink are removable without removal of any other of the IGBTs.

In another embodiment of the present invention, an alternating current (AC) electric powered vehicle includes a plurality of AC electric motors each coupled in driving relationship to a respective pair of a plurality of pairs of wheels on the vehicle and an inverter mounted in the vehicle. The inverter includes a plurality of semiconductor devices arranged for receiving DC electric power and for inverting the DC electric power to AC electric power for application to the AC electric motors, at least some of the semiconductor devices comprising IGBTs. Each IGBT is mounted in thermal transfer relationship to a base plate having a plurality of closely spaced, parallel fins extending from the base plate. The inverter further includes at least one DC link capacitor, an interconnecting bus bar and a plurality of extension bus modules with the extension bus bars each coupling the interconnecting bus bar to a respective one of the IGBTs and wherein one of the IGBTs, its extension bus bar, and its respective heat sink are removable without a removal of any other of the IGBTs.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
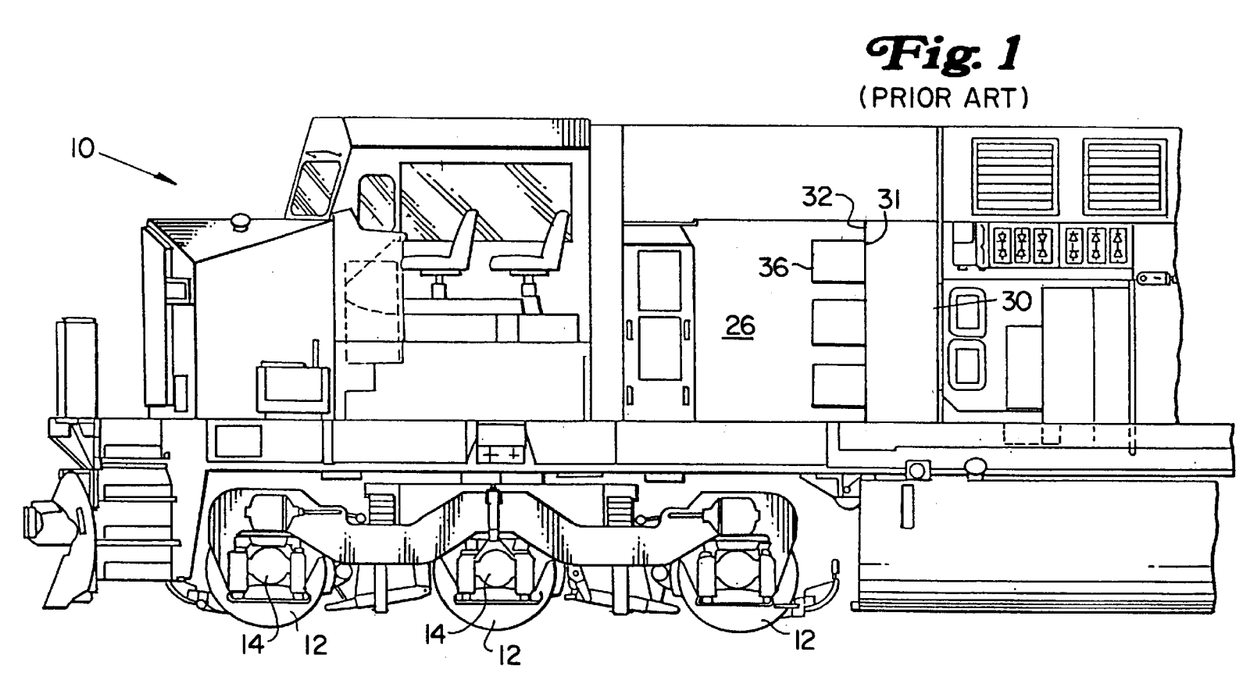
FIG. 1 is a simplified, partial schematic representation of a locomotive.

Before turning to the present invention, reference is first made to FIG. 1 which illustrates a simplified, partial cross-sectional view of a prior art electric traction vehicle 10 illustrated as a locomotive. Although a locomotive is shown in FIGS. 1 and 2, the present invention is also applicable to traction systems wherein power is received from an external power generation source and distributed via a catenary or third rail.

The locomotive 10 of FIG. 1 includes a plurality of traction motors, not visible in the figure but located behind the drive wheels 12 and coupled in driving relationship to axles 14. The motors are preferably alternating current (AC) electric motors and the locomotive includes a plurality of electrical inverter circuits for controlling electrical power to the motors.

Figure 2:
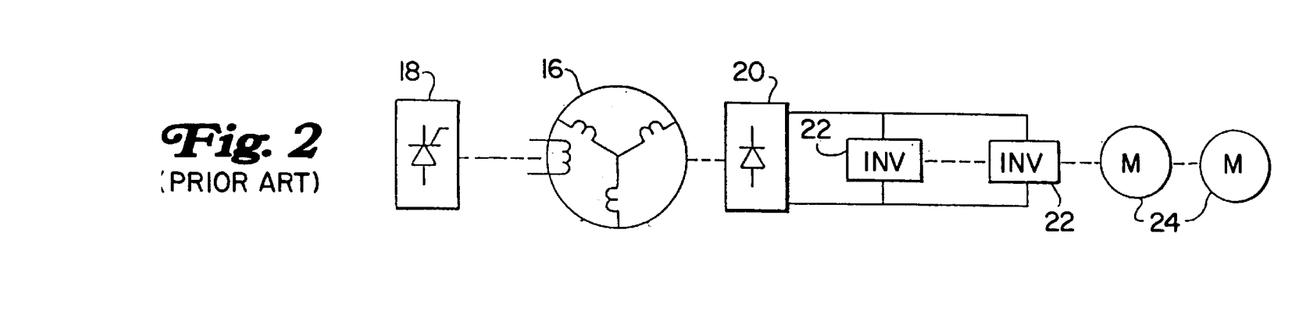
FIG. 2 is a simplified schematic representation of a power circuit for a typical traction vehicle.

FIG. 2 illustrates a simplified schematic representation of the electrical traction system for locomotive 10 including an alternator 16 driven by an on-board internal combustion engine such as a diesel engine (not shown). Power output of the alternator 16 is regulated in a well known manner by field excitation control indicated by block 18. Electrical power from alternator 16 is rectified, block 20, and coupled to inverters 22. Inverters 22 use high power semiconductor switching devices such as IGBTs or GTOs to convert the rectified power to variable frequency, variable amplitude power for application to AC motors 24.

Referring again to FIG. 1, electrical power circuits are at least partially located in equipment compartment 26. Within compartment 26, the high power semiconductor devices (not shown in FIG. 1) are mounted to air cooled heat sinks 36 which may be attached in cantilever fashion to equipment wall 32 and are generally hollow. At wall 32, the heat sinks are sealingly mounted to apertures 31 extending through wall 32. The control electronics for the inverters 22 and field control 18 as well as other electronic components are packaged in a conventional manner on circuit boards held in racks in compartment 26. Mounted outside compartment 26 are one or more blowers (now shown) which provide air cooling for the electrical compartment and the heat sinks.

Figure 3:
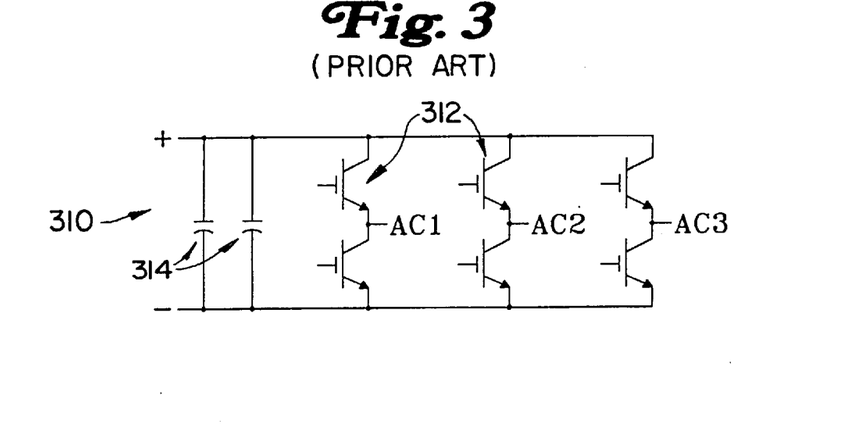
FIG. 3 is a circuit diagram of a prior art power inverter.
Figure 4:
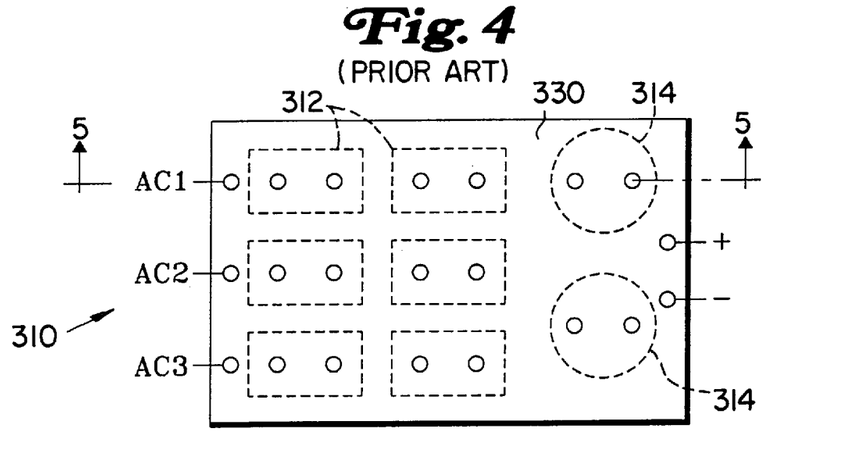
FIG. 4 is a top view of a prior art low to medium power inverter.
Figure 5:
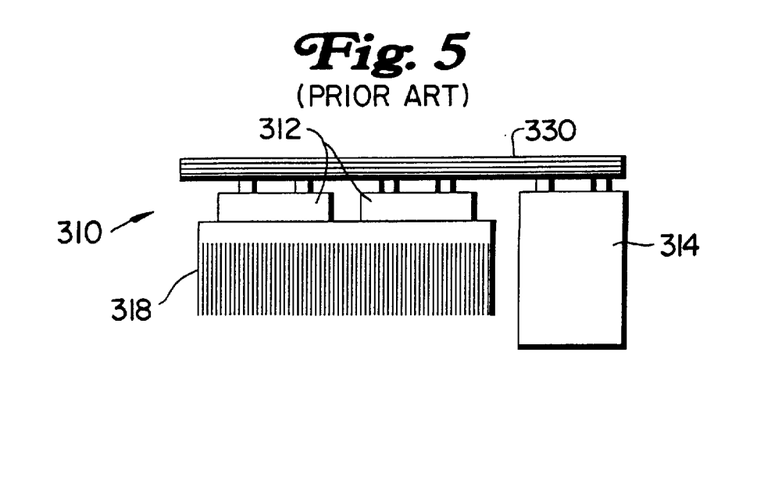
FIG. 5 is a side view along line 5—5 of FIG. 4.

FIG. 3 is a circuit diagram of a prior art power inverter 310, FIG. 4 is a top view of a one potential low to medium power circuit layout of the circuit of FIG. 3, and FIG. 5 is a sectional side view along line 5—5 of FIG. 4. A common design for low to medium power inverters includes a single five layer bus structure 330 for all three phases which interconnects six insulated gate bipolar transistor (IGBT) modules 312 and several DC link capacitors 314. In the event of a failure in an IGBT module, the entire inverter must be removed. For repair, the bus bar must be disconnected from all six IGBT modules and the DC link capacitors before a failed IGBT module can be replaced.

Figure 6:
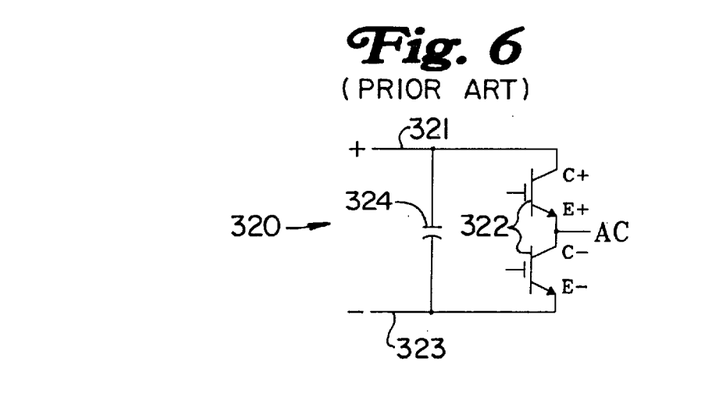
FIG. 6 is a circuit diagram of one phase of a prior art high power inverter.
Figure 7:
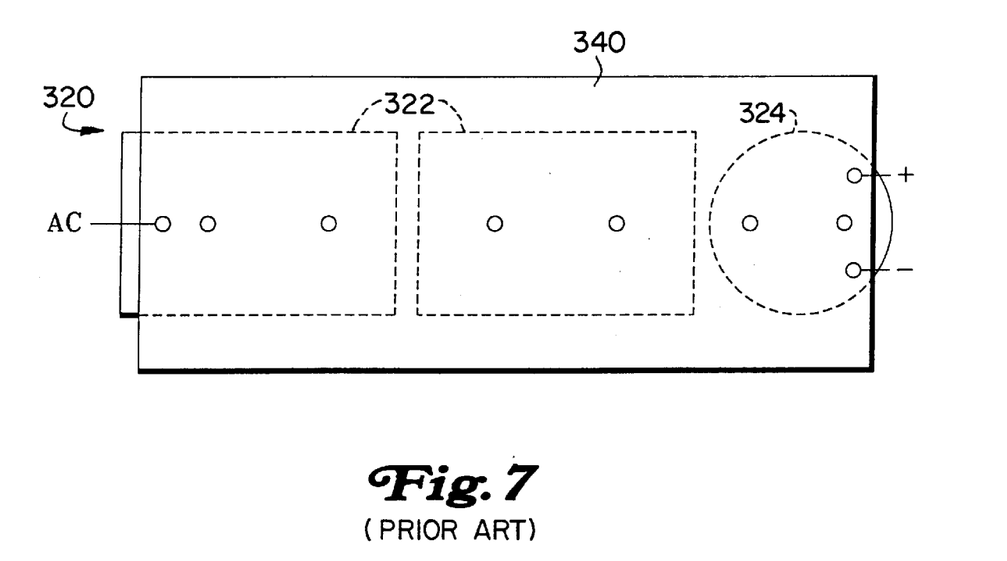
FIG. 7 is a top view of a circuit layout of the circuit of FIG. 6.

FIG. 6 is a circuit diagram of one phase of a prior art high power inverter 320, and FIG. 7 is a top view of a circuit layout of the circuit of FIG. 6. For higher power applications, a single phase assembly generally includes two coupled IGBT modules 322 with the collector of one module connected to the positive DC bus 321 and the emitter of the other module connected to the negative DC bus 323. An additional bus bar, not shown, is used to connect bus bars of three single phase assemblies to provide three phase power. In the event of an IGBT failure, the pair of IGBT modules 322 and typically the local DC link capacitor 324 need to be removed. Although a single phase assembly is removable without removing the other two phases, for high power inverters the removable section is larger and heavier than desired.

Figure 8:
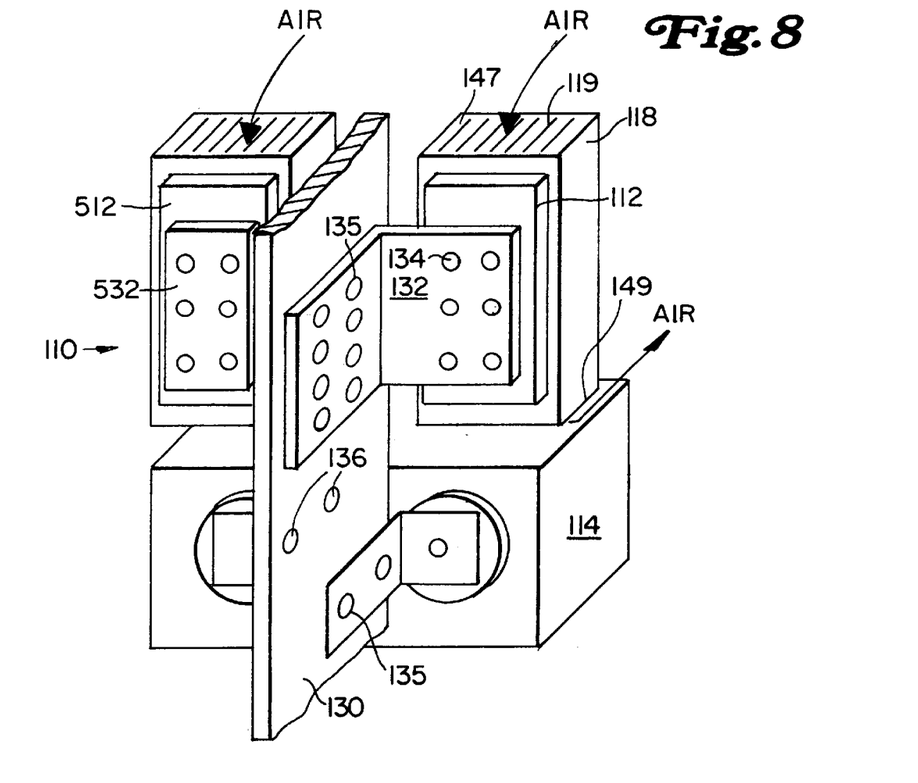
FIG. 8 is a perspective view of a modular bus bar and switch assembly of the present invention.
Figure 9:
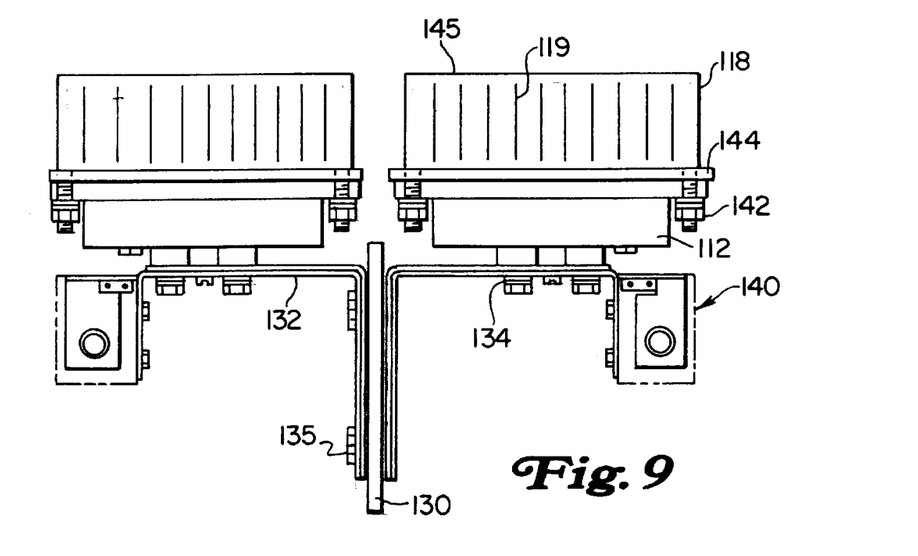
FIG. 9 is a top view of the assembly of FIG. 8.

FIG. 8 is a perspective view of a modular bus bar and switch assembly 110 of the present invention, and FIG. 9 is a top view of the assembly of FIG. 8. Because inductance is proportional to the area between the bus bar conductors and inversely proportional to the width of the conductive interconnections, the total amount of area between bus bar conductors should be minimized or kept sufficiently low so as to enable the assembly to operate without a snubber. Inductances less than $1 \times 10^{-7}$ Henries are sufficiently low for high power inverters.

In the present invention, the area between bus bar conductors and the clearance required for assembly removal were both minimized by using extension bus bars 132 and 532 which each have a ninety degree bend and are coupled to a vertical interconnecting bus bar 130 with bus bar fasteners 135 and to respective IGBT modules 112 and 512 with IGBT fasteners 134. Although ninety degree angles are shown in FIGS. 8 and 9 for purposes of example, the present invention is not limited by an angle (or lack of an angle) of the extension bus bars. An AC connection 136 is situated in the interconnecting bus bar.

In this embodiment, the IGBT module, heat sink, and extension bus bar can be disconnected from the interconnecting bus bar by undoing the bus bar fasteners 135. In one embodiment, the fasteners comprise bolts. Additional fasteners, shown as bolts 142 in FIG. 9, can be used to couple the heat sink to the IGBT module. The DC link capacitors 114 can likewise be positioned with extension bus bars 132 at ninety degree angles with respect to interconnecting bus bar 130. If desired, gate drives 140 (shown in FIG. 9) can additionally be coupled to extension bus bars 132.

In the embodiment of FIGS. 8 and 9, the heat sink fins 119 are shown as extending lengthwise in a direction substantially parallel to that of the interconnecting bus bar 130. The heat sink includes a base plate 144 and a substantially closed back surface 145 so that forced air can be directed to enter the heat sink through one open surface 147 and leave through a second open surface 149. The back surface can be formed either by a heat sink back cover or by a wall to which the heat sink is mounted.

Figure 10:
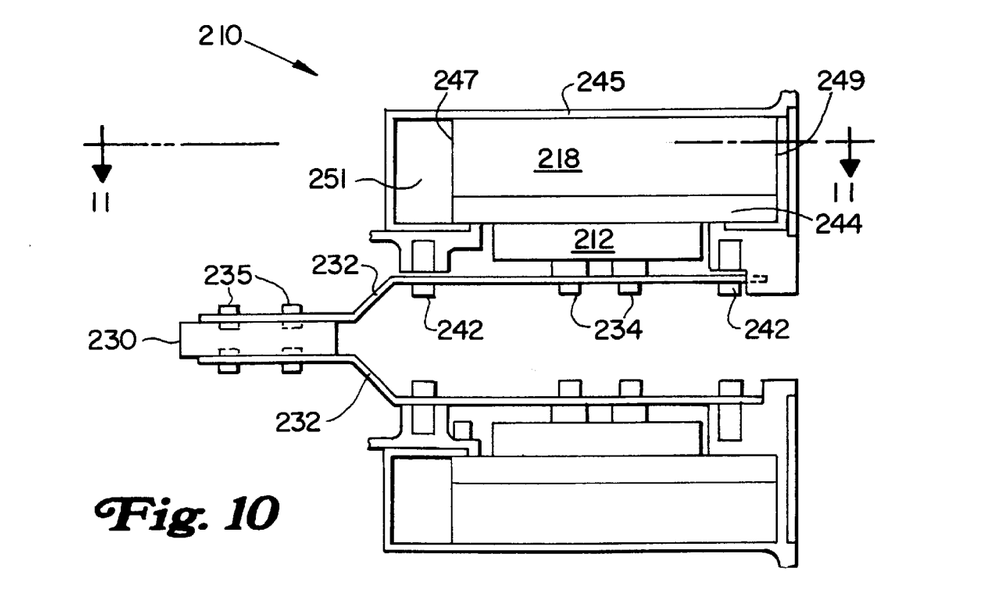
FIG. 10 is a top view of another bus bar and switch assembly of the present invention.
Figure 11:
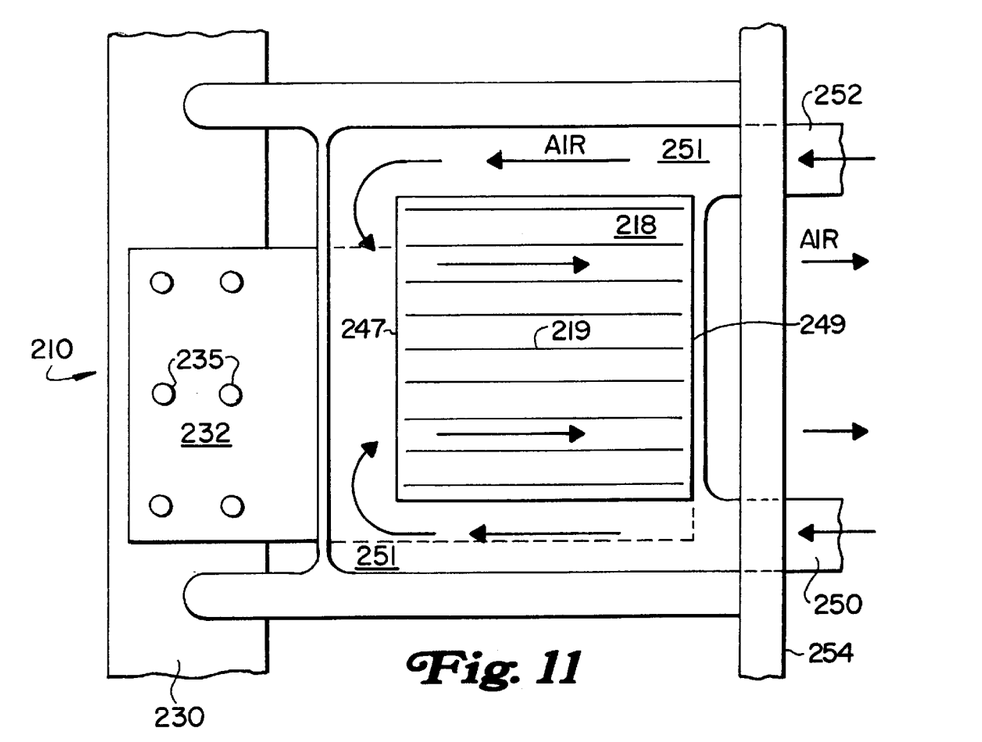
FIG. 11 is a side view of the assembly of FIG. 10.

FIG. 10 is a top view of another bus bar and switch assembly 210 of the present invention, and FIG. 11 is a sectional side view along line 11—11 of the assembly of FIG. 10. In this embodiment, instead of being situated at ninety degree angles with respect to a connecting interconnecting bus bar 230, extension bus bars 232 bring electronic switching devices, shown as IGBT modules 212, and their respective heat sinks 218 in planes which are substantially in parallel with each other and with the interconnecting bus bar to reduce the overall width of the inverter (as compared with the embodiment of FIG. 9).

As shown in FIG. 11, fins 219 of the heat sinks are situated substantially perpendicular with respect to the interconnecting bus bar 230. The heat sink 218 can have a base plate 244 and a back surface 245 with first and second open surfaces 247 and 249 for air flow. In this embodiment, two air inlets 250 and 252 can be used to direct air through an air duct 251 to the first open surface 247 which then passes through heat sink 218 and out the second open surface 249. If the heat sink is attached to a wall 254 of an electrical circuit area, the air inlets can also be attached to the wall.

Figure 12:
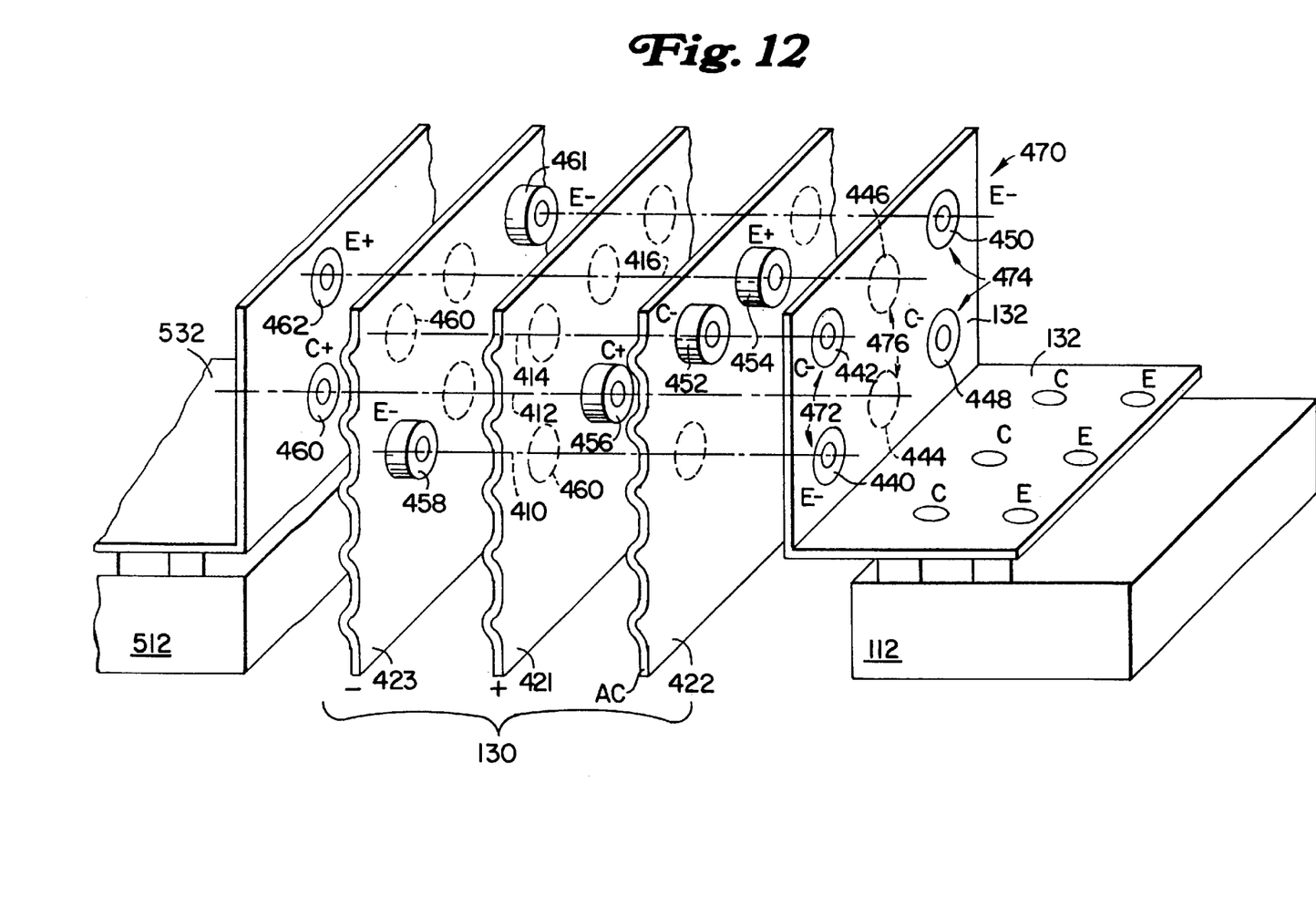
FIGS. 12 and 13 are partial expanded views of an interconnecting bus bar and offset extension bus bars.
Figure 13:
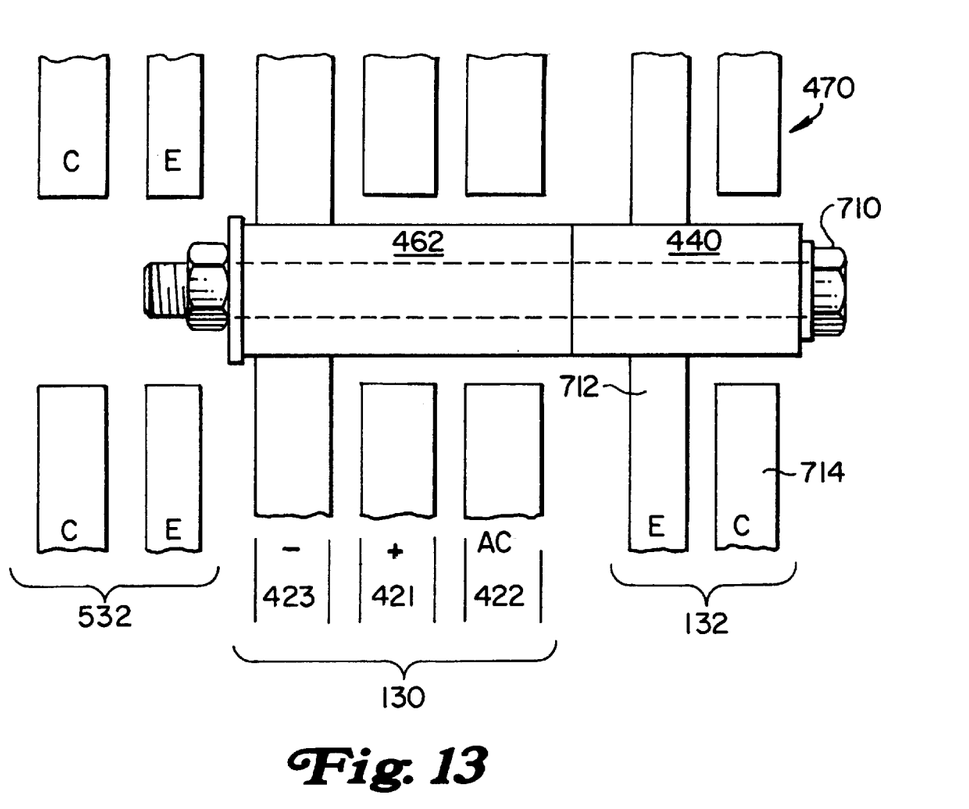

FIGS. 12 and 13 are partial expanded perspective and side views of interconnecting bus bar 130 and offset extension bus bars 132 and 532. FIG. 12 shows a useful technique of the present invention for arranging connection bushings to achieve the circuit connections of the switching arrangement shown in FIG. 6 and, for simplicity of illustration, it does not show the fasteners of FIGS. 8–11. The view is shown with ninety degree angled extension bus bars for purposes of example only.

Minimization of bus bar area is facilitated by using a laminated interconnecting bus bar 130 with conductor sections (shown as negative DC bus 423, positive DC bus 421, and AC line 422). Although not shown, insulated layers are situated between the negative and positive buses, between the positive bus and the AC line, and on the outer surfaces of the negative bus and the AC line. As shown in FIG. 13, the extension bus bars 132 and 532 may also comprise laminated bus bars with conductor sections defined by an emitter conductor 712 and a collector conductor 714 with an insulating layer (not shown) situated therebetween.

Generally the conductor sections of the bus bars comprise a metal such as copper. The conductor sections of the bus bars further include connection bushings shown as 452 and 454 on the AC line, 456 on the positive bus, 458 and 461 on the negative bus, 460 and 462 on the extension bus bar 532, 442 and 448 on the collector conductor of extension bus bar 132, and 440 and 450 on the emitter conductor of extension bus bar 132, and clearance holes shown as 460, 446, and 444. The connection bushings generally comprise metal cylinders machined from a material such as copper and can be brazed to their respective conductor sections.

As shown in FIG. 12, by selectively offsetting the extension bus bars, identical assemblies can be used for all six inverter switches. Thus all six IGBT/heat sink/ extension bus bar assemblies within an inverter can be completely interchangeable.

The offset can be provided, for example, by using an extension bus bar like 132 with a section 470 adjacent to the interconnecting bus bar and divided into two connection portions 472 and 474 with a clearance area 476 therebetween. Connection portion 472 of section 470 includes the collector connection bushing 442 and the emitter connection bushing 440. Connection portion 474 includes the emitter connection bushing 450 and the collector connection bushing 448. The positions of the emitter and collector connection bushing of portion 474 are rotated 180 degrees with respect to the positions of the emitter and collector connection bushing of portion 472. Also shown are two clearance holes 446 and 444 situated in clearance area 476.

The interconnecting bus bar connection bushings and the extension bus bar connection bushings can be coupled using a pressure connection, for example. FIG. 13 illustrates a fastener comprising a bolt 710 that is applied between interconnecting bus bar connection bushing 461 and extension bus bar connection bushing 440.

Only one portion of the section 470 needs to be used for connecting IGBT collectors and emitters to the circuit. In FIG. 12, collector connection bushing 442 and emitter connection bushing 440 are coupled to IGBT 112 (the negative switch). The collector connection bushing 442 is coupled to the collector connection busing 452 of the AC line (shown along dotted line 414), and the emitter connection bushing is coupled to emitter connection bushing 458 of the negative DC bus (shown along dotted line 410).

Although not required, it can be useful to use multiple connections. In FIGS. 12 and 13 this is shown by the coupling of negative bus bar connection bushing 461 with emitter connection bushing 450 of extension bus bar 132. Having two parallel and redundant connections for each emitter and collector provides lower current per connection bushing and lower total inductance.

Bus bar 532 can be made identical to bus bar 132. In FIG. 12, the bus bar is applied so that the emitter connection bushing 462 of bus bar 532 is aligned with a centrally located emitter connection bushing 454 of AC line 422 (shown along dotted line 416), and the collector connection bushing 460 of extension bus bar 532 is aligned with the centrally located collector connection bushing 456 of positive DC bus 421 (shown along dotted line 412). Thus by offsetting the extension bus bar 532 so that it is in substantially parallel with but does not overlap the identical area of the interconnecting bus bar as extension bar 132, the two extension bus bars (and their associated IGBT/heat sink modules) become interchangeable with each other as well as other extension bus bars of the inverter.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A modular bus bar and switch assembly for converting DC power to AC power in an electrical power system, the assembly comprising:

a plurality of electronic switching devices;

a plurality of heat sinks, each heat sink adapted to remove heat from a respective one of the electronic switching devices;

at least one DC link capacitor;

an interconnecting bus bar; and a plurality of extension bus bars, the extension bus bars each coupling the interconnecting bus bar to a respective one of the electronic switching devices or the at least one DC link capacitor, wherein each one of the electronic switching devices and its respective heat sink are removable without removal of the interconnecting bus bar or any other of the electronic switching devices, and an area between the conductors of the interconnecting bus bar and the extension bus bars which is minimized so that an inductance between each one of the electronic switching device and the at least one DC link capacitor is low.

2. The assembly of claim 1 wherein the electronic switching devices comprise insulated gate bipolar transistors (IGBTs).

3. The assembly of claim 2 wherein each of the extension bus bars coupling a respective one of the IGBTs is substantially identical to and interchangeable with each other of the extension bus bars coupling an other respective one of the IGBTs.

4. The assembly of claim 2 wherein the interconnecting bus bar comprises a laminated interconnecting bus bar and the extension bus bars comprise laminated extension bus bars.

5. The assembly of claim 2 wherein at least one of the extension bus bars has an angle of about ninety degrees and positions a respective one of the IGBTs at an angle of about ninety degrees with respect to the interconnecting bus bar.

6. The assembly of claim 5 wherein each heat sink includes a plurality of parallel fins extending in a direction substantially perpendicular to the respective IGBT, a closed back surface in a substantially parallel orientation to the respective IGBT, a first open surface through which forced air can enter the heat sink, and a second open surface through which the forced air can leave the heat sink.

7. The assembly of claim 2 wherein at least two of the extension bus bars each have an angle of about ninety degrees and position a respective one of the IGBTs at an angle of about ninety degrees with respect to the interconnecting bus bar, the at least two extension bus bars situating the two respective IGBTs in a common plane.

8. The assembly of claim 7 wherein the at least two of the extension bus bars are offset to permit the at least two of the extension bus bars and their respective IGBTs and heat sinks to be interchanged.

9. The assembly of claim 2 wherein the extension bus bars position the IGBTs in parallel with respect to the interconnecting bus bar to reduce the overall width of the assembly.

10. The assembly of claim 9 wherein each heat sink includes a plurality of parallel fins extending in a direction substantially perpendicular to the respective IGBT and to the interconnecting bus bar, a closed back surface in a substantially parallel orientation to the respective IGBT, a first open surface through which forced air can enter the heat sink, and a second open surface through which the forced air can leave the heat sink.

11. The assembly of claim 10 further including an air duct for directing the forced air to the first open surface, the air duct having air inlets.

12. An alternating current (AC) electric powered vehicle comprising:

a plurality of AC electric motors each coupled in driving relationship to a respective pair of a plurality of pairs of wheels on the vehicle;

an inverter mounted in the vehicle, the inverter including
a plurality electronic switching devices arranged for receiving DC electric power and for inverting the DC electric power to AC electric power for application to the AC electric motors,
a plurality of heat sinks, each heat sink adapted to remove heat from a respective one of the electronic switching devices;
an interconnecting bus bar and a plurality of extension bus modules, the extension bus bars each coupling the interconnecting bus bar to a respective one of the electronic switching devices, wherein one of the electronic switching devicesand its respective heat sink are removable without removal of any other of the electronic switching devicesor the interconnecting bus bar.

13. The vehicle of claim 12 wherein the electronic switching devices comprise insulated gate bipolar transistors (IGBTs) and wherein a surface area of the interconnecting bus bar and the extension bus bars is minimized.

14. The vehicle of claim 13 wherein the interconnecting bus bar comprises a laminated interconnecting bus bar and the extension bus bars comprise laminated extension bus bars.

15. The vehicle of claim 14 wherein each of the extension bus bars coupling a respective one of the IGBTs is substantially identical to and interchangeable with each other of the extension bus bars coupling an other respective one of the IGBTs.

16. The vehicle of claim 15 wherein at least one of the extension bus bars has an angle of about ninety degrees and positions a respective one of the IGBTs at an angle of about ninety degrees with respect to the interconnecting bus bar.

17. The vehicle of claim 16 wherein each heat sink includes a plurality of parallel fins extending in a direction substantially perpendicular to the respective IGBT, a closed back surface in a substantially parallel orientation to the respective IGBT, a first open surface through which forced air can enter the heat sink, and a second open surface through which the forced air can leave the heat sink.

18. The vehicle of claim 15 wherein the extension bus bars position the IGBTs in parallel with respect to the interconnecting bus bar.

19. The vehicle of claim 18 wherein each heat sink includes a plurality of parallel fins extending in a direction substantially perpendicular to the respective IGBT and to the interconnecting bus bar, a closed back surface in a substantially parallel orientation to the respective IGBT, a first open surface through which forced air can enter the heat sink, and a second open surface through which the forced air can leave the heat sink, and wherein the vehicle further includes an air duct for directing the forced air to the first open surface, the air duct having air inlets.

20. A method of fabricating an inverter for converting DC power to AC power in an electrical power system, the method comprising:

providing six substantially identical assemblies each including an extension bus bar, an electronic switching device attached to the extension bus bar, and a heat sink attached to the electronic switching device and adapted to remove heat from a respective one of the electronic switching devices;

providing at least one DC link capacitor; attached to an additional extension bus bar;

coupling each extension bus bar to an interconnecting bus bar in a manner such that each extension bus bar is removable without removal of any other extension bus bar.

21. The method of claim 20 wherein the coupling is performed by offsetting at least one extension bus bar with respect to at least one other extension bus bar.

* * * * *